United States Patent [19]  [11] 4,179,295
Takamizawa et al.  [45] Dec. 18, 1979

[54] ORGANOPOLYSILOXANE CONTAINING PLANOGRAPHIC MASTERS

[75] Inventors: Minoru Takamizawa; Yoshio Inoue; Toshikazu Sugita, all of Annaka, Japan

[73] Assignee: Shin-Etsu Chemical Co. Ltd., Tokyo, Japan

[21] Appl. No.: 802,318

[22] Filed: Jun. 1, 1977

[30] Foreign Application Priority Data

Jun. 7, 1976 [JP] Japan .................. 51/66256

[51] Int. Cl.$^2$ ...................... G03G 1/71; G03F 7/02
[52] U.S. Cl. ...................... 428/447; 430/303; 430/49; 101/462;
[58] Field of Search ............ 96/33, 35.1, 87 R, 115 R, 96/1.5 N, 1 SD, 85; 428/447; 101/453

[56] References Cited

U.S. PATENT DOCUMENTS

| | | | |
|---|---|---|---|
| 3,865,588 | 2/1975 | Ohto et al. | 96/33 |
| 3,886,865 | 6/1975 | Ohto et al. | 96/33 |
| 3,907,564 | 9/1975 | Boardman et al. | 96/33 |
| 3,924,520 | 12/1975 | Boardman et al. | 96/33 |
| 3,945,957 | 3/1976 | Noshiro et al. | 96/33 |

Primary Examiner—Roland E. Martin, Jr.
Assistant Examiner—John L. Goodrow
Attorney, Agent, or Firm—Toren, McGeady and Stanger

[57] ABSTRACT

Planographic master with which a dry planographic printing plate is prepared comprises a substrate and an overlying layer of a photocurable organopolysiloxane composition. The composition comprises (a) an organopolysiloxane having aliphatically unsaturated linkages in the molecule, (b) an mercapto-containing organopolysiloxane, and (c) a photosensitizer. The dry planographic printing plate is prepared by providing imagewise patterns on the organopolysiloxane layer of the planographic master, the organopolysiloxane layer having been cured or being cured by irradiation with ultraviolet light to effect crosslinking by the photochemical addition reaction of the aliphatically unsaturated linkages and the mercapto groups. The printing plates, having ink-receptive image areas and ink-repellent non-image areas, can be used in dry planographic printing, and exhibit quite sufficient printability, especially for office use, to produce satisfactory printed copies.

9 Claims, No Drawings

ORGANOPOLYSILOXANE CONTAINING PLANOGRAPHIC MASTERS

BACKGROUND OF THE INVENTION

The present invention relates to novel and improved planographic masters and a method for prepareing planographic printing plates suitable for dry planographic printing, using the planographic masters.

Planographic printing plates in the prior art are prepared by providing, on the surface of substrate, image areas or oleophilic areas which have an affinity with a printing ink but are hardly wetted with water and non-image areas or hydrophilic areas which have an ink-repellent property but are readily wetted with water. The printing process with the printing plates is carried out by first moistening the non-image areas with a dampening solution, giving the printing ink to the image areas and then transferring the printing ink retained on the image areas to sheets of paper of the like to be printed.

Various troublesome problems have been encountered with the prior art planographic printing plates as a consequence of the use of a dampening solution. Some of the problems are (1) that the printing ink is apt to become emulsified, (2) that the density of the printed colors is controlled with difficulty, (3) that the process tends to cause dimensional changes to printed sheets and bring about inferiority in precision printing or multi-colored printing, (4) that complicated structure and mechanisms are required by printing presses employed in the press, and (5) that the preparation of the printing plates is very complicated and requires very fine technique due to the etching process involved.

Recently, there have been proposed improved planographic masters with which no etching process is involved in the plate making process concerned and with which dry planographic printing can be performed without a dampening solution, taking the advantage of the excellent ink-repellency of a silicone or an organopolysiloxane composition as the material for forming the non-image areas of the printing plates. (See, for example, Japanese Patent Public Disclosure 48-19305 disclosing a planographic master which is prepared by coating the substrate with a substance capable of electrostatically forming latent images and providing, over the layer of coating then dried, a cured layer of a silicone.)

However, the above printing plates have been found unsatisfactory in view of their inferior printing durability due to lack of bonding strength between the image area-forming material and the silicone layer. This is so, for example, when the formation of ink-receptive image areas on the dry planographic printing plates is intended by providing an image area-forming material on the planographic masters by means of the electrophotographic process or the socalled direct image process involving typewriting or handwriting or drawing, both of which processes have recently gained wide-spread acceptance in printing, especially with light printing machines suitable for office use, where the desired printing durability is rather small, but sufficient such that printed copies as many as about 1,000 to 2,000 are obtained by a single printing plate.

Further, in order to improve the bonding strength between the image area-forming material and the silicone layer on the printing plates, various methods have been proposed (see Japanese Patent Public Disclosures Nos. 49-21204, 50-71405, 50-71406, 50-78403, 50-78404, 50-78405, and 51-16105). However, the proposed methods have been found defective with respect to ink-repellency, printing durability, storage stability, or the like as well as easiness in the plate making process.

SUMMARY OF THE INVENTION

The present invention has been completed as a result of the extensive investigations of the inventors for purpose of solving the above-described problems in the prior art dry planographic printing process. An object of the present invention is therefore to provide a planographic master suitable for the preparation of a dry planographic printing plate using an organopolysiloxane composition as the ink-repellent material. Another object of the invention is to provide a method for preparing a dry planographic printing plate with the planographic master by the electrophotographic process or the so-called direct image process. A further object of the invention is to provide the dry planographic printing plate suitable for use with light office printing machines.

The planographic master of the present invention comprises a substrate and, on the substrate, a coating layer of an organopolysiloxane composition comprising (a) an organopolysiloxane with aliphatically unsaturated linkages in the molecule containing organosiloxane units represented by the general formula $$R^1(R^2)_n SiO_{(3-n)/2} \qquad (I)$$

where $R^1$ is a monovalent hydrocarbon group with an aliphatically unsaturated linkage, $R^2$ is a substituted or unsubstituted monovalent hydrocarbon group with from 1 to 10 carbon atoms, free of aliphatic unsaturation and having no mercapto group and n is zero, 1 or 2, in a mole fraction of from 0.1 to 100 mole %, the balance being organosiloxane units represented by the general formula $$(R^3)_m SiO_{(4-m)/2} \qquad (II)$$

where $R^3$ has the same meaning as $R^2$ and m is zero, 1, 2, or 3, (b) a mercapto-containing organopolysiloxane containing organosiloxane units represented by the general formula $$R^4(R^5)_p SiO_{(3-p)/2} \qquad (III)$$

where $R^4$ is an organic group with at least one mercapto group bonded to a carbon atom, $R^5$ has the same meaning as $R^2$ and p is zero, 1 or 2, in a mole fraction of from 0.1 to 100 mole %, the balance being organosiloxane units represented by the general formula $$(R^6)_q SiO_{4-q/2} \qquad (IV)$$

where $R^6$ has the same meaning as $R^2$ and q is zero, 1, 2 or 3, in an amount that is sufficient to provide from 0.02 to 50 moles of the mercapto groups bonded to the carbon atoms per mole of the aliphatically unsaturated linkages in component (a), and (c) a photosensitizer.

DETAILED DESCRIPTION OF THE PREFERRED EMBODIMENTS

The most fundamental properties of an organopolysiloxane composition required as the ink-repellent material in the making of a dry planographic printing master are such that:

(1) The coating layer formed by the composition on the substrate should have a good storage stability, exhibiting good sensitivity even after a prolonged storage and it should be uniformly cured by a simple process in a short time.

(2) Sufficiently strong bonding should be obtained between the cured organopolysiloxane layer and the image area-forming material, such as the toner in the electrophotographic process, or the writing material in the direct image process, and (3) That the cured organopolysiloxane layer should have good ink-repellency as well as strong bonding to the surface of the substrate so that printing durability, or the number of printed copies obtained by one printing plate, is sufficiently large.

The organopolysiloxane composition employed in the present invention which comprises the above-described components (a), (b) and (c) satisfies all of these requirements. Namely, the composition can be cured to a sufficient extent only by irradiation with light and without heat treatment, leading to a very simple plate making process. Further, the organopolysiloxanes in the composition have a reactive structure in the molecule so that a remarkably effective bonding strength can be obtained between the cured composition and the image area-forming materials.

In the above formulas (I) and (II), the aliphatically unsaturated monovalent hydrocarbon groups denoted by symbol $R^1$ are exemplified by vinyl, allyl and ethynyl groups; the monovalent hydrocarbon groups denoted by symbol $R^2$ or $R^3$ are exemplified by methyl, ethyl, propyl and phenyl groups and those groups which are obtained by substitution of part or all of the hydrogen atoms in the hydrocarbon groups by halogen atoms, amino groups and other substituents other than mercapto groups; and n and m are each positive integers as defined.

The aliphatically unsaturated monovalent hydrocarbon groups $R^1$ in the organosiloxane units represented by formula (I) serve as the crosslinking units by addition reaction with the mercapto groups in component (b) to cure the organopolysiloxane composition. Therefore, the organopolysiloxane as component (a) has desirably at least two of the organosiloxane units in a molecule and the molar fraction of this type of organosiloxane units in component (a) should be at least 0.1 mole % or, preferably, at least 0.5 mole %.

The method for the preparation of organopolysiloxanes of this type is well known in the art. The organopolysiloxane may be linear, branched, i.e. resinous, or cyclic in its molecular configuration. Further, the position at which the monovalent hydrocarbon groups with aliphatic unsaturation are bonded to the organopolysiloxane molecules is not limitative; it may be at the ends of the molecular chain or an intermediate position.

The examples of component (a) are given in the following. In the formulas and anywhere hereinafter, Me, Ph, and Vi denote methyl, phenyl and vinyl groups, respectively.

(1) 1,3,5,7-tetramethyl-1,3,5,7-tetravinyl cyclotetrasiloxane (2) $Me_3SiO+Ph_2SiO)_{\overline{20}}(Me_2SiO)_{\overline{500}}(ViMeSiO)_{\overline{10}}SiMe_3$ (3) an organopolysiloxane with resinous structure expressed by the formula $(Me_2SiO)_{400}(PhSiO_{1.5})_{25}-(CH_2=CHCH_2SiO_{1.5})_5$ (4) $Me_3SiO+ViMeSiO)_{\overline{4}}(Me_2SiO)_{\overline{50}}SiMe_3$ (5) $Me_3SiO+(C_3H_6NHC_2H_4NH_2)MeSiO)_{\overline{5}}(Me_2SiO)_{\overline{200}}+ViMeSiO)_{\overline{15}}SiMe_3$ (6) $Me_3SiO+(C_2H_4SC_2H_4COOH)MeSiO)_{\overline{3}}(Me_2SiO)_{\overline{35}}+(ViMeSiO)_{\overline{5}}SiMe_3$ (7) $ViMe_2SiO+Ph_2SiO)_{\overline{20}}(ViMeSiO)_{\overline{10}}(Me_2SiO)_{\overline{320}}SiMe_2Vi$ (8) $Me_3SiO+(C_2H_4SC_2H_4OH)MeSiO)_{\overline{5}}(ViMeSiO)_{\overline{10}}+Me_2SiO)_{\overline{200}}SiMe_3$ The mercapto-containing organopolysiloxane as component (b) contributes to crosslinking by the addition reaction of the mercapto groups with the aliphatically unsaturated linkages in component (a). This organopolysiloxane is composed of from 0.1 to 100 mole % of the organosiloxane units represented by formula (III) and from 99.9 to 0 mole % of the organosiloxane units represented by formula (IV), respectively.

In formula (III), symbol $R^4$ denotes a monovalent organic group with at least one mercapto group. The organic groups are exemplified by $-C_3H_6SH$, $-CH_2SH$, $-C_6H_4SH$, $-C_2H_4CH(CH_2SH)_2$, $-C_2H_4C(C_2H_4SH)_3$, $-C_2H_4SCH_2CH(CH_2SH)_2$, $-C_2H_4SCH_2C(CH_2SH)_3$, and the like. The function of the mercapto groups in these groups is to form crosslinks by way of addition reaction with the aliphatically unsaturated linkages in component (a). Therefore, it is desirable that the organopolysiloxane as component (b) has at least two mercapto groups bonded to the carbon atoms in a molecule and the molar fraction of the mercapto-containing organosiloxane units in the component (b) should be at least 0.1 mole % or, preferably, at least 0.5 mole %.

On the other hand, the organosiloxane units represented by formula (IV) do not pertain to crosslinking and their presence in component (b) is optional. The monovalent hydrocarbon groups denoted by symbol $R^5$ or $R^6$ are selected from the same groups as for $R^2$ or $R^3$ in component (a), and p and q are each zero or positive integers as defined hereinbefore.

The method for the preparation of the mercapto-containing organopolysiloxanes is well known in the art. The organopolysiloxane may be linear, branched, i.e. resinous, or cyclic in its molecular configuration. There are also no limitations in the size of the molecules and the position at which the mercapto-containing organic groups are bonded to the molecules.

The examples of the mercapto-containing organopolysiloxanes as component (b) are given in the following.

(9) $Me_3SiO+(C_3H_6SH)MeSiO)_{\overline{4}}(Me_2SiO)_{\overline{24}}SiMe_3$

(10) $Me_3SiO+(C_3H_6SH)MeSiO)_{\overline{10}}SiMe_3$

(11) a hydrolysis-condensation product of mercaptomethyl methyl dimethoxysilane

(12) an organopolysiloxane with resin structure expressed by the formula $(Me_2SiO)_{350}((C_2H_4CF_3)-MeSiO)_{50}(PhSiO_{1.5})_{25}(HSC_3H_6SiO_{1.5})_5$

(13) a co-hydrolysis-condensation product of a silane mixture composed of 10 mole % of trimethylmethoxysilane, 10 mole % of 3-mercaptopropyl trimethoxysilane and 80 mole % of dimethyldimethoxysilane.

As to the ratio of components (a) and (b) in the formulation of the organopolysiloxane composition in accordance with the present invention, it is a principle that the aliphatically unsaturated linkages in component (a) and the mercapto groups in component (b) should be equimolar to each other so that an aliphatically unsaturated linkage and a mercapto group pertain in addition reaction to form crosslinking. It is, however, permissible or rather advisable for the reason given hereinafter that either one of the aliphatically unsaturated linkages or the mercapto groups is in excess over the other. In the case of such an uneven formulation, the range of the ratio of these two components is such that the molar ratio of the aliphatically unsaturated linkages in component (a) to the mercapto groups in component (b) is from 50:1 to 1:50 or, preferably, from 10:1 to 1:10.

It is of course that each of components (a) and (b) is not necessarily a single kind of the organopolysiloxane but can be a mixture of two or more of the organopolysiloxanes within the definition of each component.

In the photochemical addition reaction of components (a) and (b) to form crosslinking in the curing of the composition, the addition of a photosensitizer to the composition is required in most cases to give a sufficient velocity to the curing. The photosensitizer as component (c) used for the purpose is selected from those known in the art exemplified by 4-phenylphenol, 2,4-dinitrophenol, benzaldehyde, benzophenone, acetophenone, Michler ketone, anthraquinone, 1,2-naphthoquinone, 3-methyl-1,3-diazo-1,4-benzanthrone, malachite green, rhodamine blue, 2,4,6-triphenylpyrilium perchlorate, and the like. Any one of these photosensitizers is effective in the present invention although the most preferred are the organosilyl-substituted benzophenone derivatives, such as 4-trimethylsilyl benzophenone and 4-dimethylamino-4'-dimethylvinylsilyl benzophenone as disclosed in U.S. patent application Ser. No. 569,756, now U.S. Pat. No. 4,042,613.

The amount of the photosensitizer to be added to the composition is not specifically limitative, but it is determined in accordance with several factors, such as the kinds of components (a) and (b), the ratio of the amounts of these components, the desired curing velocity, and the like. Usually the amount of the photosensitizer is in the range from 0.05 to 5% by weight based on the total amount of components (a) and (b). It may be increased without any disadvantages when the photosensitizer is an organosilyl-substituted benzophenone derivative.

The composition composed of components (a), (b) and (c) can be cured rapidly by irradiation with light to form a cured film having excellent physical properties. Among others, the most essential property is bonding strength of the composition either before or after curing and the image area-forming materials, such as the toner employed in the electrophotography. Therefore, the presence in components (a) and/or (b) of a structure or group having compatibility or affinity with the image area-forming materials is highly desired in order to give strong bonding. Suitable structure or group may vary in accordance with the kind of the toner material.

In the organopolysiloxane composition used in the present invention, either the aliphatically unsaturated hydrocarbon groups such as vinyl groups in component (a) or the mercapto groups in component (b) still remain unreacted even after the completion of crosslinking by irradiation with light in accordance with the uneven blending ratios of these two components. In addition, the photochemically cured composition contains thioether linkages C—S—C formed by addition reaction between the unsaturated linkages and the mercapto groups. It is an advantage of the present invention that particular groups with reactivity or miscibility with the toner material need not be introduced into the organopolysiloxane composition of the present invention, since the above-described unsaturated linkages, mercapto groups or thioether linkages all have strong affinity with most kinds of toner material.

However, certain toner materials may require the presence of specific reactive or miscible groups as the substituents of the organopolysiloxanes in the composition. Such a reactive or miscible group may be selected, in accordance with the toner material, from functional groups, such as amino, imino, hydroxy, carboxyl, nitrile, halogen-substituted organic groups, thioether linkage-containing organic groups and the like, when an increased reactivity is desired, while aryl groups, such as phenyl groups, halogenated aryl groups and alkaryl groups, may contribute to the improvement of the miscibility of the organopolysiloxane composition with the toner materials. It is meant by the introduction of the functional organic groups that the group represented by symbol $R^2$, $R^3$, $R^5$, or $R^6$ in formulas (I), (II), (III) and (IV) is a substituted hydrocarbon group having the functional groups or linkages chosen above, or the aryl, halogenated aryl or alkaryl groups.

Among the above-mentioned examples of components (a) and (b), compounds (2), (3), (5), (6), (7), (8) and (12) are given to illustrate the organopolysiloxanes that have reactive or miscible groups or linkages of that kind.

The amount of the organosiloxane units having the reactive or miscible groups or linkages, including the aliphatically unsaturated linkages and the mercapto groups, in components (a) and (b) is preferably in the range from 0.1 to 30 mole % of the total amount of the organosiloxane units in components (a) and (b), although it may differ widely in accordance with the material of the toner and the like. When the amount is less than the above range, the bonding strength of the composition to the toner material is insufficient and, in some cases, tends to result in the decreased printing durability of a planographic printing plate prepared with the composition, while a too much amount of the reactive or miscible groups or linkages in the composition, disadvantageously from the standpoint of practical application, leads to a poorer ink-repellency of the cured film, causing scumming to the printed copies.

The organopolysiloxane composition of the present invention can be prepared by merely blending components (a), (b) and (c) by a suitable means, optionally with a solvent added to facilitate the application of the composition to the surface of the substrate. The solvents for the purpose may be toluene, methylethylketone, hexane, trichloroethylene, ethyl acetate, and the like. A single solvent or mixture of solvents can be used. The amount of the solvent is adjusted so that the composition will have a suitable viscosity for coating operations according to coating means and the coating layer will have a desired thickness.

Further, it is optional to add small amounts of a silane coupling agent, filler, coloring agent, anti-oxidation agent and the like into the organopolysiloxane composition, if necessary.

The planographic master of the present invention can be prepared by coating a substrate in the form of sheet with the organopolysiloxane composition or its solution as described hereinbefore. The substrate is paper, plastics film, polyethylene-laminated paper, polyvinyl alcohol-coated paper or the like. The coating process is carried out by using of any known coating machines, such as a roll coater, flow coater, spray coater and the like. The amount of the coating composition or solution is such that the resulting coating layer will have a thickness preferably in the range from 0.5 to 20 μm as dried. The planographic masters thus prepared is then dried if necessary, with heating. The above process for the preparation of the masters is carried out in dark.

The planographic master thus prepared is provided with patterns with an image area-forming material, such as a toner, on the coating layer of the organopolysiloxane composition, to form a dry planographic printing plate. In the making of the dry planographic printing plates, irradiation with light is performed to cure the composition by crosslinking in accordance with either of the following two processes. One of the processes is to perform the irradiation after the image-wise patterns have been formed on the organopoly-siloxane coating layer, and the other is to perform the irradiation before the image-wise patterns are formed on the cured organopolysiloxane layer.

In accordance with the present invention, the image-wise patterns that correspond to original letters, symbols, figures and the like to be printed are formed on the cured organopolysiloxane layer of the photographic master. The method for forming the patterns may be an electro-photographic process in which they are formed with the toner or the so-called direct image process in which they are formed by typewriting or handwriting. The pattern-forming materials, such as the toner or the writing ink, contain a vehicle or resin component having a sufficient affinity with the organopolysiloxane composition and should be bonded firmly with the layer of the organopolysiloxane composition when molten by heating.

According to the above first process of irradiation, the photographic master bearing the imagewise patterns is irradiated with light to cure the organopolysiloxane composition by crosslinking formation to make the planographic printing plate of the present invention. The light source is a lamp emitting ultraviolet light, preferably, rich in the region of shorter wave lengths, such as a high-pressure mercury lamp and a xenon lamp. The irradiation should be directed either to the backside or the substrate, i.e. the side where the toner images are not provided or to the frontside, i.e. the side where the toner images are provided, when both the substrate and the toner are transparent. When the substrate is transparent while the toner is opaque, the irradiation should be direct to the backside. Further, when the substrate is opaque while the toner is transparent, the irradiation should be directed to the frontside. It is not recommendable to use a combination of an opaque substrate and an opaque toner in the first process of irradiation, since if often causes part of the organopolysiloxane composition, namely the areas covered by the toner material, to remain insufficiently cured. In such a case, it is preferred to employ the second process of irradiation. The intensity and dose of the light in the irradiation should be adjusted in accordance with the organopolysiloxane composition.

The second process of irradiation is more versatilely applicable. It is applicable even when both the substrate and the toner are opaque, since this process is carried out by the sequential steps, i.e. the photocuring of the organopolysiloxane composition and then the forming of the image-wise patterns on the thus cured layer of the composition.

The surface of the planographic printing plate of the present invention obtained by the first or second process of irradiation is composed of the nonimage areas where the cured organopolysiloxane layer having an excellent ink-repellency is exposed and the image areas formed on the cured organopolysiloxane layer with the image area-forming materials, such as toner, having a good ink-receptivity. Hence, any printing processes using the printing plates of the present invention require no dampening solution, and can be carried out by a simple mechanism that a printing ink supplied to the plate surface sticks only to the image areas, wherefrom it is transferred to materials to be printed, such as paper, to form a very sharp print which is a high-fidelity reproduction of the original without scumming. The dry planographic printing plates of the invention are advantaged also in the mechanical strength of the cured organopolysiloxane layer and the strong bonding of the same cured layer with the image area-forming materials, such as toner, and, as a result, excellent printing durability can be achieved.

Having now generally described the present invention, the same will be more specifically described with the aid of the following specific, but non-limiting examples.

EXAMPLE 1

Preparation of the solutions of the organopolysiloxane composition 1,3,5,7-Tetramethyl-1,3,5,7-tetravinylcyclotetrasiloxane (I) and a mercapto-containing organopolysiloxane (II) with a viscosity of about 5,000 to 10,000 centistokes at 25° C. composed of 3-mercaptopropylmethylsiloxane units and dimethylsiloxane units in the proportion as indicated in Table I in mole % of the former units and terminated at both chain ends with trimethylsilyl groups were taken in the ratio as indicated in the table by the molar ratio SH/Vi of the mercapto groups SH to the vinyl groups Vi and admixed with 2% by weight of benzophenone (III) based on the total amount of the components (I) and (II). The above-obtained mixtures were each dissolved in a 1:1 by volume mixed solvent of toluene and methylethylketone to give solutions of the organopolysiloxane compositions No. 1 to No. 7 with a solid content of 15% by weight. No. 1 was for comparative purpose and No. 2 to No. 7 were directed to the present invention.

Table I

| Composition No. | 3-Mercaptopropyl-methylsiloxane units, mole % | SH/Vi Molar ratio |
|---|---|---|
| 1 | 0.01 | 1/2 |
| 2 | 0.1 | 1/4 |
| 3 | 1.0 | 1/1 |
| 4 | 5.0 | 1/1 |
| 5 | 10.0 | 10/1 |
| 6 | 20.0 | 10/1 |
| 7 | 30.0 | 10/1 |

Preparation of the planographic masters and printing plates

A substrate sheet of wood paper having a basis weight 120 g/m² with anti-solvent resistance imparted by coating with an aqueous solution of polyvinyl alcohol in an amount of 2 g/m² as dried was employed. The substrate sheets were coated with one of the solutions of the organopolysiloxane compositions as given in Table I in an amount sufficient to form layers 3 μm thick as dried. The thus coated substrates were then irradiated with an ultra-high pressure mercury lamp of the intensity 150 W/m² for 40 seconds to prepare planographic masters having a cured surface layer of the organopolysiloxane composition.

On the surface of the thus prepared masters were formed images of an epoxy resin-based toner by use of a xerographic copying machine (Model ES-X-10, product of Tokyo Aircraft Instrument Co.). The toner images were fixed by heating at 130° C. for 60 seconds to produce dry planographic printing plates No. 1 to No. 7, corresponding to the compositions No. 1 to No. 7 respectively. The bonding strength of the toner to the surface of each cured organopolysiloxane film is shown in Table II.

Printing test

Printing tests were undertaken with the above-obtained dry planographic printing plates on a smallsize offset printing press (Model A. B. Dick 320, product by A. B. Dick Co.). No scumming took place on each printed copies. The resulting printing durability is shown in Table II.

Table II

| Printing plate No. | Bonding strength of toner | Printing durability (number of printed copies) |
|---|---|---|
| 1 | Poor | below 10 |
| 2 | Fair | 100 to 200 |
| 3 | Good | 700 to 900 |
| 4 | Good | more than 1000 |
| 5 | Good | more than 1000 |
| 6 | Good | more than 1000 |
| 7 | Good | more than 1000 |

Further, in order to determine the storage stability of the planographic masters, each planographic master having the substrate with a photocured layer of each of the organopolysiloxane compositions was allowed to stand over a period of 6 months and then subjected to the formation and fixation of toner images. The resulting planographic masters exhibited a sufficient bonding strength and also a satisfactory printability.

EXAMPLE 2

Preparation of the solutions of the organopolysiloxane compositions:

Mixtures were prepared by blending organopolysiloxane (I) with a viscosity in the range from 100,000 to 500,000 centistokes at 25° C. composed of 3 mole % of methylvinylsiloxane units and diphenylsiloxane units in the mole fractions as indicated in Table III, the balance being dimethylsiloxane units, and terminated at both chain ends with trimethylsilyl groups, a mercapto-containing organopolysiloxane (II) expressed by the formula

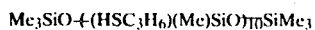

and 4-trimethylsilylbenzophenone (III) as the photosensitizer. The blending ratios was such that component (I) to component (II) molar ratio was to give the molar ratio of the vinyl groups (Vi) to the mercapto groups (SH) as indicated in Table III, while component (III) was used in an amount of 3% by weight based on the total amount of components (I) and (II). The mixtures were each dissolved in a 1:1 by volume mixed solvent of toluene and methylethylketone in a solid concentration of 15% by weight to give the solutions of the organopolysiloxane compositions No. 8 to No. 14.

Preparation of the planographic masters and the printing plates

Sheets of a polyethylene-laminated paper as the substrate were coated with each solution of the above organopolysiloxane compositions prepared in an amount sufficient to form a layer about 2 μm thick as dried. The thus coated substrate was irradiated with light from an ultrahigh pressure mercury lamp in an intensity of 150 W/m² for 60 seconds to produce planographic masters with cured layer.

Then, on the surface of the planographic masters were formed images with a toner based on a styrene-maleic anhydride copolymeric resin by use of the same xerographic copying machine as in Example 1 and the toner images were fixed by heating at 130° C. for 60 seconds to form the dry planographic printing plates No. 8 to No. 14 corresponding to the solutions of the organopolysiloxane compositions No. 8 to No. 14, respectively. The bonding strength of the toner to the surface of the masters was good enough.

Printing tests: The printing tests were undertaken just in the same manner as in Example 1 with the planographic printing plates obtained as above. The results are shown in Table III.

Table III

| Composition or printing plate No. | Diphenyl-siloxane units, mole % | Vi/SH molar ratio | Scumming | Printing durability number of printed copies |
|---|---|---|---|---|
| 8 | 5 | 1/1 | No | 700 to 900 |
| 9 | 10 | 1/1 | No | More than 1000 |
| 10 | 20 | 1/1 | No | More than 1000 |
| 11 | 30 | 1/1 | A little | More than 1000 |
| 12 | 10 | 1/2 | No | More than 1000 |
| 13 | 10 | 1/5 | No | More than 1000 |
| 14 | 10 | 1/7 | A little | More than 1000 |

EXAMPLE 3

A solution was prepared by dissolving an organopolysiloxane composition composed of organopolysiloxane (I) having a block structure expressed by the formula

a hydrolysiscondensate of mercaptomethylmethyldimethoxysilane (II) and 4-dimethyl-amino-4'-trimethylsilylbenzophenone (III) as the photosensitizer, in the ratio such that the molar ratio of the allyl groups to the mercapto groups was ½ and the amount of the photosensitizer was 2% by weight based on the total amount of components (I) and (II), in a 1:1 by volume mixed solvent of toluene and methylethylketone with a solid concentration of 15% by weight.

The solution thus prepared was applied to the surface of a polyvinyl alcohol-coated paper in an amount sufficient to form a coating film 3 μm thick as dried, to obtain a planographic master. Then images were formed on the dried layer of the planographic master with a polystyrene-based toner by use of the same xerographic copying machine as in Example 1, followed by heat fixing at 100° C. for 30 seconds and photocuring of the organopolysiloxane composition by irradiation with ultraviolet light from an ultrahigh pressure mercury lamp in an intensity of 150 W/m² for 60 seconds, to obtain a dry planographic printing plate. The bonding strength of the toner to the cured organopolysiloxane layer was satisfactory.

Printing test was undertaken with the above-obtained printing plate in the same manner as in Example 1. Ink-repellency at the non-image areas was good and over 2,000 printed copies were obtained with no scumming.

Further, in order to determine the storage stability of the planographic masters, each planographic master with coated and dried substrate was allowed to stand over a period of 6 months unexposed to light and then subjected to the formation and fixation of toner images, followed by photocure in a similar manner. The resulting planographic masters exhibited a sufficient bonding strength and also a satisfactory printability.

EXAMPLE 4

An organopolysiloxane composition was prepared by blending a mercapto-containing organopolysiloxane with a block structure expressed by the formula $$(Me_2SiO)_{250}(Me(C_2H_4CF_3)SiO)_{30}(PhSiO_{1.5})_{20}(HSC_3H_6SiO_{1.5})_6$$

a vinyl-containing organopolysiloxane expressed by the formula $$Me_3SiO(ViMeSiO)_5(Me_2SiO)_5SiMe_3,$$

the blending ratio of these two organopolysiloxanes being such that the mercapto groups to the vinyl groups SH/Vi was ½ by mole, a third organopolysiloxane of a resin structure expressed by the average unit formula $$(Me_3SiO_{0.5})_{0.8}(Me_2ViSiO_{0.5})_{0.2}(SiO_2)_1$$

in an amount of 10% by weight based on the first organopolysiloxane, 3-mercaptopropyl trimethoxysilane as a silane coupling agent in an amount of 1% by weight also based on the first organopolysiloxane and Michler ketone in an amount of 2% by weight based on the total amount of the three kinds of the organopolysiloxanes. The resultant composition was dissolved in a 1:1 by volume mixed solvent of toluene and methylethylketone in a solid concentration of 15% by weight. The resultant solution was applied on a polyethylene-laminated paper having a basis weight of 90 g/m² in an amount enough to give a coating film of about 5 μm thick as dried, to produce a planographic master.

Toner images were formed on the dried layer of the organopolysiloxane composition with an epoxy resin-based toner by use of the same xerographic copying machine as used in Example 1, followed by heat-fixing at 100° C. for 30 seconds and then photocuring the composition by irradiation with ultraviolet light from an untrahigh pressure mercury lamp in an intensity of 150 W/m² for 60 seconds, to prepare a dry planographic printing plate. The bonding strength of the toner to the cured layer of the organopolysiloxane composition was satisfactory.

Printing test was undertaken with the planographic printing plate thus prepared in the same manner as in Example 1. Ink-repellency at the non-image areas was good, and over 2,000 printed copies were obtained with no scumming.

EXAMPLE 5

The substrate employed here was an electrophotographic master paper (Ricohfax Master Longrun, product by Richo Co., Japan). The photosensitive surface of this substrate paper was coated with a solution of an organopolysiloxane composition in an amount of 1 g/m² as dried, to form a planographic master. The coating solution used was prepared by dissolving a vinyl-containing organopolysiloxane having a viscosity of 200,000 centistokes at 25° C., terminated at both chain ends with vinyldimethylsilyl groups and composed of 10 mole % of diphenylsiloxane units, 5 mole % of methylvinylsiloxane units, a mercapto-containing organopolysiloxane expressed by the formula $$Me_3SiO((HSC_3H_6)MeSiO)_{10}SiMe_3$$

the blending ratio of these two organopolysiloxanes being such that the vinyl groups to the mercapto groups Vi/SH was 1:1 by mole, and benzophenone as a photosensitizer in an amount of 3% by weight based on the total amount of the organopolysiloxanes in n-hexane in a solid concentration of 10% by weight.

The planographic master thus formed was irradiated with ultraviolet light from an untrahigh pressure mercury lamp in an intensity of 150 W/m² for 120 seconds to cure the organopolysiloxane composition. Thereafter, toner images were formed on the photocured layer of the organopolysiloxane composition with an epoxy resin-based toner by use of an electrofax copying machine (Elefax PC-301W, product of Iwatsu Co., Japan), followed by heat fixing at 120° C. for 60 seconds, to prepare a dry planographic printing plate.

Printing test was undertaken with the printing plate prepared above in the same manner as in Example 1. Ink-repellency at the non-image areas was good and over 1,000 printed copies were obtained with no scumming.

EXAMPLE 6

Solutions of four kinds of organopolysiloxane compositions were prepared with an organopolysiloxane having a viscosity of 50,000 to 100,000 centistokes at 25° C. composed of 0.5, 3, 7 or 10 mole % of the amino-containing organopolysiloxane units expressed by the formula $$(NH_2C_2H_4NHC_3H_6)MeSiO,$$

96.5, 94, 90 or 87 mole % of dimethylsiloxane units and 3 mole % of vinylmethylsiloxane units, respectively, and terminated at both chain ends with trimethylsilyl groups, a mercapto-containing organopolysiloxane composed of 20 mole % of $Me_3SiO_{0.5}$ units, 40 mole % of $HS(CH_2)_3SiO_{1.5}$ units and 40 mole % of $Me_2SiO$ units, the blending ratio of the vinyl-containing organopolysiloxane and the mercapto-containing organopolysiloxane being such that the vinyl groups to the mercapto groups Vi/SH was ½ by mole and 4-dimethylamino-4'-dimethylvinylsilyl benzophenone as a photosensitizer in an amount of 2% by weight based on the total amount of the organopolysiloxanes dissolved in toluene in a solid concentration of 15% by weight.

Polyethylene-laminated paper was coated with the solution prepared as above in an amount to form a coating film 2 μm thick as dried, and irradiated with ultraviolet light from an ultrahigh pressure mercury lamp in an intensity of 150 W/m² to cure the organopolysiloxane composition. Toner images were formed on the thus cured layer of the organopolysiloxane composition with an epoxy resin-based toner by use of a the same xerographic copying machine as used in Example 1, to prepare planographic printing plates. The bonding strength of the toner to the cured layer of the organopolysiloxanes was satisfactory in each case.

Printing plates were undertaken with the dry planographic printing plates prepared above in the same manner as in Example 1. Ink-repellency was good at the non-image areas of the printing plates and over 1,000 printed copies were obtained with no scumming in each of the individual test runs.

EXAMPLE 7

A coating solution of an organopolysiloxane composition was prepared with an organopolysiloxane having a viscosity of 200,000 centistokes at 25° C. composed of 5 mole % of the carboxyl-containing organosiloxane units expressed by the formula

Me(HOOCCH₂SCH₂CH₂)SiO, 90 mole % of dimethylsiloxane units and 5 mole % of vinylmethylsiloxane units and terminated at both chain ends with trimethylsilyl groups, the 3-mercaptopropyl-containing organopolysiloxane expressed by the formula

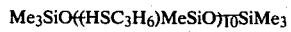
Me₃SiO((HSC₃H₆)MeSiO)₁₀SiMe₃ the blending ratio of these two organopolysiloxanes being such that the vinyl groups to the mercapto groups Vi/SH was 1/1 by mole and trimethylsilyl benzophenone as a photosensitizer in an amount of 1% by weight based on the total amount of the organopolysiloxanes dissolved in n-hexane in a solid concentration of 15% by weight.

The solution obtained above was applied on the photo-sensitive layer of zinc oxide dispersed in a resin binder on an electrophotographic paper in an amount enough to form a coating film 5 μm thick as dried to prepare a photographic master. The master was irradiated with ultraviolet light from an ultrahigh pressure mercury lamp in an intensity of 150 W/m² to cure the organopolysiloxane composition and, tereafter, toner images were formed on the cured layer of the organopolysiloxane composition with an epoxy resin-based toner by use of the same electrofax copying machine as used in Example 5, followed by heat fixing at 120° C. for 60 seconds to give a dry planographic printing plate.

Printing test was undertaken with the printing plate above prepared in the same manner as in Example 1. Ink-repellency was good and over 2,000 printed copies were obtained with no scumming.

EXAMPLE 8

A coating solution of an organopolysiloxane composition was prepared with an organopolysiloxane having a viscosity of 300,000 centistokes at 25° C. composed of 3 mole % of the organosiloxane units expressed by the formula

Me(HOCH₂CH₂SCH₂CH₂)SiO, 3 mole % of vinylmethylsiloxane units and 94 mole % of dimethylsiloxane units and terminated at both chain ends with trimethylsilyl groups, a 3-mercaptopropyl-containing organopolysiloxane expressed by the formula

Me₃SiO((HSC₃H₆)MeSiO)₁₀SiMe₃ the blending ratio of these two organopolysiloxanes being such that the vinyl groups to the mercapto groups Vi/SH was 1/1 by mole and benzophenone as a photosensitizer in an amount of 3% by weight based on the total amount of the organopolysiloxanes dissolved in toluene in a solid concentration of 15% by weight.

A polyethylene-laminated paper was coated with the coating solution prepared above in an amount enough to give the coating film 3 μm thick as dried, and irradiated with ultraviolet light from an ultrahigh pressure mercury lamp in an intensity of 150 W/m² for 180 seconds to cure the organopolysiloxane composition to give a planographic master. Toner images were formed on the cured layer of the organopolysiloxane composition of the master with a phenolic resin-based toner by use of the same xerographic copying machine as used in Example 1, followed by heat fixing at 130° C. for 30 seconds to prepare a dry planographic printing plate.

Printing test was undertaken with the printing plate in the same manner as in Example 1. The bonding strength of the toner to the cured organopolysiloxane composition was good and over 1,000 printed copies were obtained with no scumming.

What is claimed is:

1. In a planographic master composed of a substrate and an overlying layer of an organopolysiloxane composition and a photosensitizer, the improvement which comprises said organopolysiloxane composition being composed of
(a) an organopolysiloxane with aliphatically unsaturated linkages in the molecule containing organosiloxane units represented by the general formula

$R^1(R^2)_n SiO_{(3-n)/2}$ where
$R^1$ is vinyl, allyl, or ethynyl,
$R^2$ is a substituted or unsubstituted monovalent hydrocarbon group with from 1 to 10 carbon atoms, free of aliphatic unsaturation and having no mercapto group and
n is zero, 1 or 2, in a mole fraction of from 0.1 to 100 mole %, the balance being organosiloxane units represented by the general formula

$(R^3)_m SiO_{(4-m)/2}$ where
$R^3$ has the same meaning as $R^2$ above and
m is zero, 1, 2 or or 3, and (b) a mercapto-containing organopolysiloxane containing organosiloxane units represented by the general formula $$R^4(R^5)_p SiO_{(3-p)/2}$$

where

R$^4$ is an organic group with at least one mercapto group bonded to a carbon atom selected from the group consisting of —C$_3$H$_6$SH, —CH$_2$SH, —C$_6$H$_4$SH, —C$_2$H$_4$CH(CH$_2$SH)$_2$, —C$_2$H$_4$C(C$_2$H$_4$SH)$_3$, —C$_2$H$_4$SCH$_2$CH(CH$_2$SH)$_2$, and —C$_2$H$_4$SCH$_2$C(CH$_2$SH)$_3$, R$^5$ has the same meaning as R$^2$ and p is zero, 1 or 2, in a mole fraction of from 0.1 to 100 mole %, the balance being organosiloxane units represented by the general formula $$(R^6)_q SiO_{(4-q)/2}$$

where

R$^6$ has the same meaning as R$^2$ and q is zero, 1, 2 or 3, in an amount that is sufficient to provide from 0.02 to 50 moles of the mercapto groups bonded to the carbon atoms per mole of the aliphatically unsaturated linkages in component (a), and wherein the amount of component (b) is such that from 0.1 to 10 moles of the mercapto groups in component (b) are provided per mole of the aliphatically unsaturated linkages in component (a), and the amount of the photosensitizer is from 0.05 to 5% by weight based on the total amount of components (a) and (b).

2. The planographic master as claimed in claim 1, wherein the number of the organosiloxane units represented by the general formula $$R^1(R^2)_n SiO_{(3-n)/2}$$

contained per molecule of component (a) is at least two.

3. The planographic master as claimed in claim 1, wherein the mole fraction of the organosiloxane units represented by the general formula $$R^1(R^2)_n SiO_{(3-n)/2}$$

contained in component (a) is at least 0.5 mole %.

4. The planographic master as claimed in claim 1, wherein the organic group with at least one mercapto group bonded to a carbon atom denoted by R$^4$ is selected from the group consisting of: —C$_3$H$_6$SH, —CH$_2$SH, —C$_6$H$_4$SH, —C$_2$H$_4$CH(CH$_2$SH)$_2$, —C$_2$H$_4$C(C$_2$H$_4$SH)$_3$, —C$_2$H$_4$SCH$_2$CH(CH$_2$SH)$_2$ and —C$_2$H$_4$SCH$_2$C(CH$_2$SH)$_3$.

5. The planographic master as claimed in claim 1, wherein the mole fraction of the organopolysiloxane units represented by the general formula $$R^4(R^5)_p SiO_{(3-p)/2}$$

contained in component (b) is at least 0.5 mole %.

6. The planographic master as claimed in claim 1, wherein component (c) is an organosilyl-substituted benzophenone.

7. The planographic master as claimed in claim 1, wherein from 0.1 mole % to 30 mole % of the organosiloxane units in components (a) and (b) have a substituent containing an atom, group or linkage selected from the class consisting of halogen atoms, mercapto group, amino group, imino group, hydroxy group, carboxyl group, nitrile group, halogenated alkyl groups, aryl groups, halogenated aryl groups, alkaryl groups, aliphatically unsaturated linkages and thioether linkage.

8. The planographic master as claimed in claim 1, wherein the substrate is paper.

9. The planographic master as claimed in claim 1, wherein the overlying layer is from 0.5 to 20 μm thick.

* * * * *